United States Patent
Sidhu et al.

(10) Patent No.: US 9,913,382 B2
(45) Date of Patent: Mar. 6, 2018

(54) METHOD FOR ANCHORING A CONDUCTIVE CAP ON A FILLED VIA IN A PRINTED CIRCUIT BOARD AND PRINTED CIRCUIT BOARD WITH AN ANCHORED CONDUCTIVE CAP

(71) Applicant: Viasystems Technologies Corp., L.L.C., St. Louis, MO (US)

(72) Inventors: Rajwant Sidhu, Brea, CA (US); Ruben Zepeda, Yorba Linda, CA (US)

(73) Assignee: VIASYSTEMS TECHNOLOGIES CORP. L.L.C., St. Louis, MO (US)

( * ) Notice: Subject to any disclaimer, the term of this patent is extended or adjusted under 35 U.S.C. 154(b) by 0 days.

(21) Appl. No.: 14/694,756

(22) Filed: Apr. 23, 2015

(65) Prior Publication Data

US 2016/0316563 A1    Oct. 27, 2016

(51) Int. Cl.
| | |
|---|---|
| H05K 3/00 | (2006.01) |
| H05K 3/42 | (2006.01) |
| H05K 1/11 | (2006.01) |
| H05K 3/06 | (2006.01) |

(52) U.S. Cl.
CPC .......... *H05K 3/0094* (2013.01); *H05K 1/113* (2013.01); *H05K 3/422* (2013.01); *H05K 3/064* (2013.01); *H05K 3/423* (2013.01); *H05K 2201/09481* (2013.01); *H05K 2201/09563* (2013.01); *H05K 2203/095* (2013.01)

(58) Field of Classification Search
CPC .......... H05K 1/116; H05K 3/04; H05K 3/422; H05K 3/423; H05K 3/0094; H05K 3/064; H05K 2201/09563

USPC ............ 174/254, 262, 263, 264; 25/751
See application file for complete search history.

(56) References Cited

U.S. PATENT DOCUMENTS

| | | | |
|---|---|---|---|
| 4,700,473 A | 10/1987 | Freyman et al. | |
| 5,286,926 A | 2/1994 | Kimura et al. | |
| 5,576,052 A | 11/1996 | Arledge et al. | |
| 5,585,673 A * | 12/1996 | Joshi ................ | H01L 21/76838 257/751 |
| 6,555,761 B2 * | 4/2003 | Amir .................... | H05K 3/0094 174/263 |
| 7,875,809 B2 * | 1/2011 | Chang .................. | H05K 3/4602 174/254 |
| 2003/0070931 A1 | 4/2003 | Kitchens | |
| 2008/0083558 A1 | 4/2008 | Chujo et al. | |
| 2008/0196935 A1 * | 8/2008 | Sidhu ..................... | H05K 3/423 174/264 |
| 2009/0308651 A1 * | 12/2009 | Abe ....................... | H05K 3/445 174/264 |

(Continued)

OTHER PUBLICATIONS

International Search Report and Written Opinion from International Application No. PCT/US2016/028600, dated Jul. 26, 2016; 8 pgs.

*Primary Examiner* — Timothy Thompson
*Assistant Examiner* — Michael F McAllister
(74) *Attorney, Agent, or Firm* — Polsinelli PC (57) ABSTRACT

The present invention relates to forming an anchored cap in a filled via in a PCB. The cap is formed by making an anchor opening in the filled via, depositing copper into the anchor opening to form an anchor portion, and subsequently depositing a cap portion over the filled via and the anchor portion, so that the anchored cap is anchored to the filled via by the anchor portion. In another embodiment, the anchor portion and cap portion may be deposited in one step.

12 Claims, 9 Drawing Sheets

(56) References Cited

U.S. PATENT DOCUMENTS

2010/0326716 A1* 12/2010 Zhang .................... H05K 1/024
                                                          174/262
2013/0270703 A1    10/2013 Zierath et al.
2014/0264920 A1     9/2014 Yang et al.

* cited by examiner

INITIAL
STRUCTURE

FORM ANCHOR
OPENING

METALIZE (E.G., DEPOSIT
ELECTROLESS COPPER)

FORM
PHOTORESIST
MASK

ELECTROPLATE
COPPER

INITIAL STRUCTURE

FORM ANCHOR OPENING

METALIZE (E.G., DEPOSIT ELECTROLESS COPPER)

FORM PHOTORESIST MASK

ELECTROPLATE COPPER

REMOVE PHOTORESIST

*FIG. 3D*

METHOD FOR ANCHORING A CONDUCTIVE CAP ON A FILLED VIA IN A PRINTED CIRCUIT BOARD AND PRINTED CIRCUIT BOARD WITH AN ANCHORED CONDUCTIVE CAP

FIELD

Embodiments described herein relate to printed circuit boards (PCBs) and in particular to methods for fabricating conductive caps on filled vias in printed circuit boards and to printed circuit boards with anchored conductive caps.

BACKGROUND

Fabricating a multilayer PCB generally requires a method for forming connections between the conductors in the various layers of the PCB, and to points on the outer conductive layers of the PCB. One such method is to form a conductive cap on one layer at any via (e.g., a blind hole, a through hole, a buried hole, etc.); the cap may then form a connection point for a wire or component terminal, or a conductive cap of another PCB. Such caps must remain in reliable contact with the via, and in particular it must not become separated from the via when the PCB undergoes temperature excursions, as, e.g., when components are soldered to the PCB. Thus, there is a need for a method of fabricating conductive caps on filled vias that result in the caps securely attached to the filled vias in the PCB.

SUMMARY

An aspect of an embodiment of the present invention is directed toward a method for forming a conductive cap on a via in a PCB. In one embodiment, the method includes forming an anchor opening in the via fill material, depositing a layer of metal in the anchor opening, to form an anchor portion, planarizing the PCB, and forming a cap portion over the anchor portion.

An aspect of an embodiment of the present invention is directed toward a PCB with an anchored conductive cap. In one embodiment, an anchored cap on a filled via in the PCB is provided. The anchored cap includes an anchor portion extending into an anchor opening in the via fill material in the filled via and a cap portion protruding above the surface of the PCB on top of the filled via, and secured to the anchor portion.

According to an embodiment of the present invention there is provided a method for forming an anchored cap on a filled via in a printed circuit board (PCB). The method includes: removing via fill material from the filled via to form an anchor opening; metalizing the anchor opening; forming an anchor portion in the filled via; and forming a conductive cap portion over the anchor portion to form an anchored cap.

In one embodiment the removing of the via fill material from the filled via is performed using a plasma resin removal process.

In one embodiment the removing of the via fill material from the filled via is performed by mechanical drilling.

In one embodiment the removing of the via fill material from the filled via is performed by laser drilling.

In one embodiment the metalizing of the anchor opening is performed using an electroless plating process.

In one embodiment the metalizing of the anchor opening is performed using a sputtering process.

In one embodiment the metalizing of the anchor opening is performed using a vapor deposition process.

In one embodiment the forming of the anchor portion in the filled via includes electroplating the metallized anchor opening and planarizing the printed circuit board.

In one embodiment the forming of the anchor portion in the filled via includes: forming a first photoresist mask over the surface of the printed circuit board; electroplating the metallized anchor opening; removing the first photoresist mask; and planarizing the printed circuit board; and the forming of the cap portion over the anchor portion includes: forming a second photoresist mask over the surface of the printed circuit board; electroplating over the anchor portion; and removing the second photoresist mask.

In one embodiment the forming of the anchor portion in the filled via is concurrent with the forming of the conductive cap portion over the anchor portion.

In one embodiment the forming of the anchor portion in the filled via and the forming of the conductive cap portion over the anchor portion include: electroplating the metallized anchor opening and a region surrounding the anchor opening on the surface of the printed circuit board.

In one embodiment the forming of the anchor portion in the filled via and the forming of the conductive cap portion over the anchor portion include: forming a photoresist mask over the surface of the printed circuit board; electroplating the metallized anchor opening and a region surrounding the anchor opening on the surface of the printed circuit board; and removing the photoresist mask.

According to another embodiment of the present invention there is provided an anchored cap on a filled via in a printed circuit board (PCB). The anchored cap includes: an anchor portion extending into an anchor opening in the filled via; and a conductive cap portion protruding above the surface of the PCB on top of the anchor portion.

In one embodiment the anchor portion in the filled via is 0.01 to 25 mils deep.

In one embodiment the anchor portion in the filled via is 1 to 10 mils deep.

In one embodiment the anchor opening has a diameter from 2 to 50 mils.

In one embodiment the anchor opening has a diameter from 4 to 20 mils.

According to another embodiment of the present invention there is provided a printed circuit board (PCB). The printed circuit board (PCB) includes: a substrate having a filled via, the filled via having an anchor opening; an anchor portion extending into the anchor opening in the filled via; and a conductive cap portion protruding above the surface of the PCB on top of the anchor portion.

In one embodiment the anchor portion in the filled via is 0.01 to 25 mils deep.

In one embodiment the anchor portion in the filled via is 1 to 10 mils deep.

In one embodiment the anchor opening has a diameter from 2 to 50 mils.

In one embodiment the anchor opening has a diameter from 4 to 20 mils.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of the exemplary embodiments of the present invention including a method for anchoring a conductive cap on a filled via in a printed circuit board provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Pursuant to an embodiment of the present invention, a method of manufacturing a printed circuit board (PCB) or a sub-component of a PCB having a plurality of circuit layers with at least one via for interconnecting copper patterns on the different circuit layers of the PCB or the sub-component of the PCB is provided. The method includes: laminating the plurality of circuit layers with each other to form the PCB or the sub-component of the PCB with a first solid copper layer and a second solid copper layer respectively as both outermost layers of the PCB; drilling the hole into the laminated circuit layers; de-smearing the drilled hole; metalizing the circuit layers with the de-smeared hole to metalize the hole; coating a first photo resist on both the outermost layers; patterning the first photo resist on the circuit layers with a first photo dot to expose the metalized hole; electrolytic copper plating the metalized hole with a electrolytic plating solution to plate the metalized hole having the first photo dot to a desired copper thickness; stripping the first photo resist; filling the copper plated hole with a via fill material and curing the via fill material in the via filled hole; planarizing the via fill material and the platted first photo dot; and forming a conductive cap to cover the filled and planarized hole.

Figure 1:
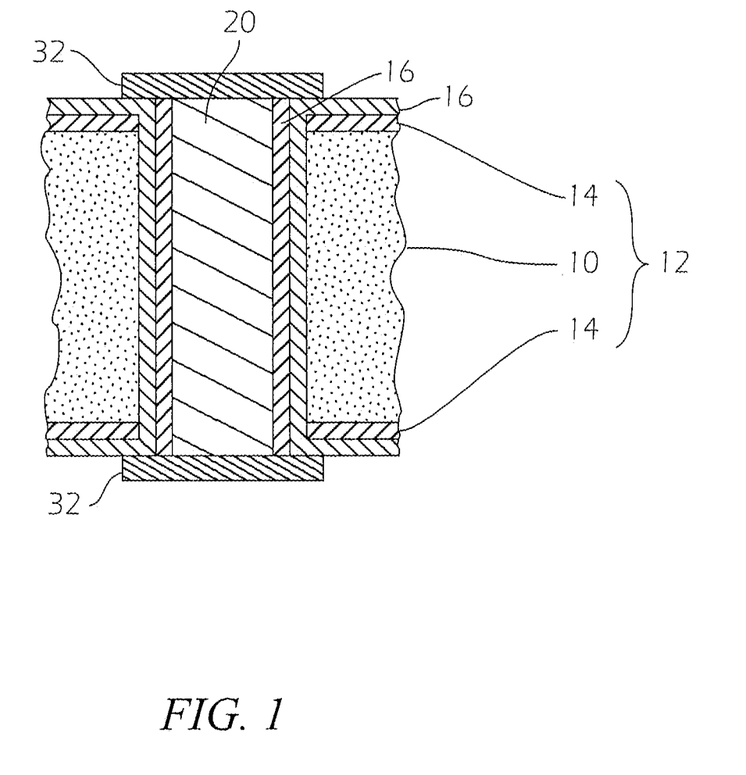
FIG. 1 is a cross-sectional breakaway view of a via with conventional caps provided on the upper and lower surfaces of the via.

Referring to FIG. 1, in a related art embodiment, a PCB substrate 12 is formed from a sheet of dielectric, or core material 10, sandwiched between copper foils 14. The PCB may have one or more filled vias (e.g., conductive through holes), formed for example by first making a via in the sandwich by drilling or by laser drilling, and then plating some combination of the inner surface of the via and the top and bottom surfaces of the sheet, with one or more layers of copper. The via may then be filled with a conductive or non-conductive material known as via fill material 20.

A cap 32 is illustrated in FIG. 1. However, this cap 32 has the disadvantage of forming a weak bond with the via fill material 20, and it is secured to the underlying copper layers 16 only over a small annular region where the cap 32 is in contact with them. The relatively weak connection between the cap 32 and the underlying PCB may cause it to become detached when the PCB undergoes temperature excursions, as, for example, when components are soldered to the PCB.

Figure 2A:
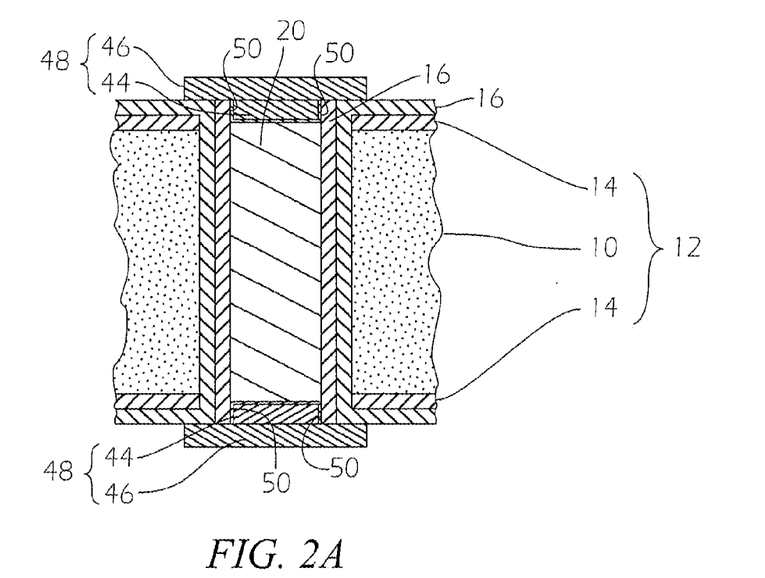
FIG. 2A is a cross-sectional breakaway view of a via with an anchored cap according to an embodiment of the present invention.
Figure 2B:
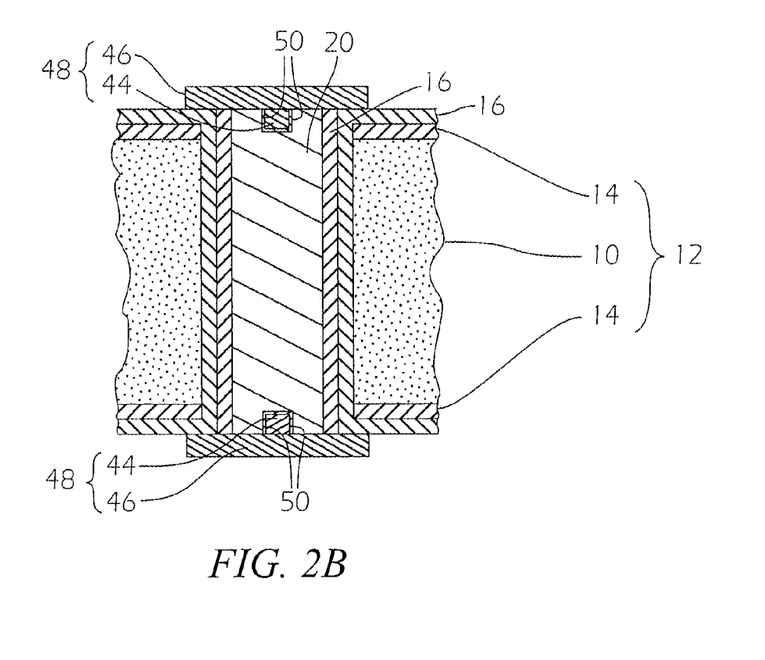
FIG. 2B is a cross-sectional breakaway view of a via with an anchored cap according to another embodiment of the present invention.

Referring to FIG. 2A, a cap 48 may be more securely attached to the surface of a PCB by fabricating it in the form of an anchored cap 48 which extends into an anchor opening in a via. In the embodiment illustrated, the anchor portion 44 of the cap 48 extends into the opening, providing additional contact area, or anchor points 50, between the cap 48 and the plated copper layers 16. Referring to FIG. 2B, in another embodiment, a smaller diameter anchor portion 44 may be used instead to anchor the cap 48. In this embodiment the anchor portion 44 provides additional surface area between the cap 48 and the via fill material 20, resulting in the cap 48 being more securely attached to the surface of the PCB.

Figure 3A:
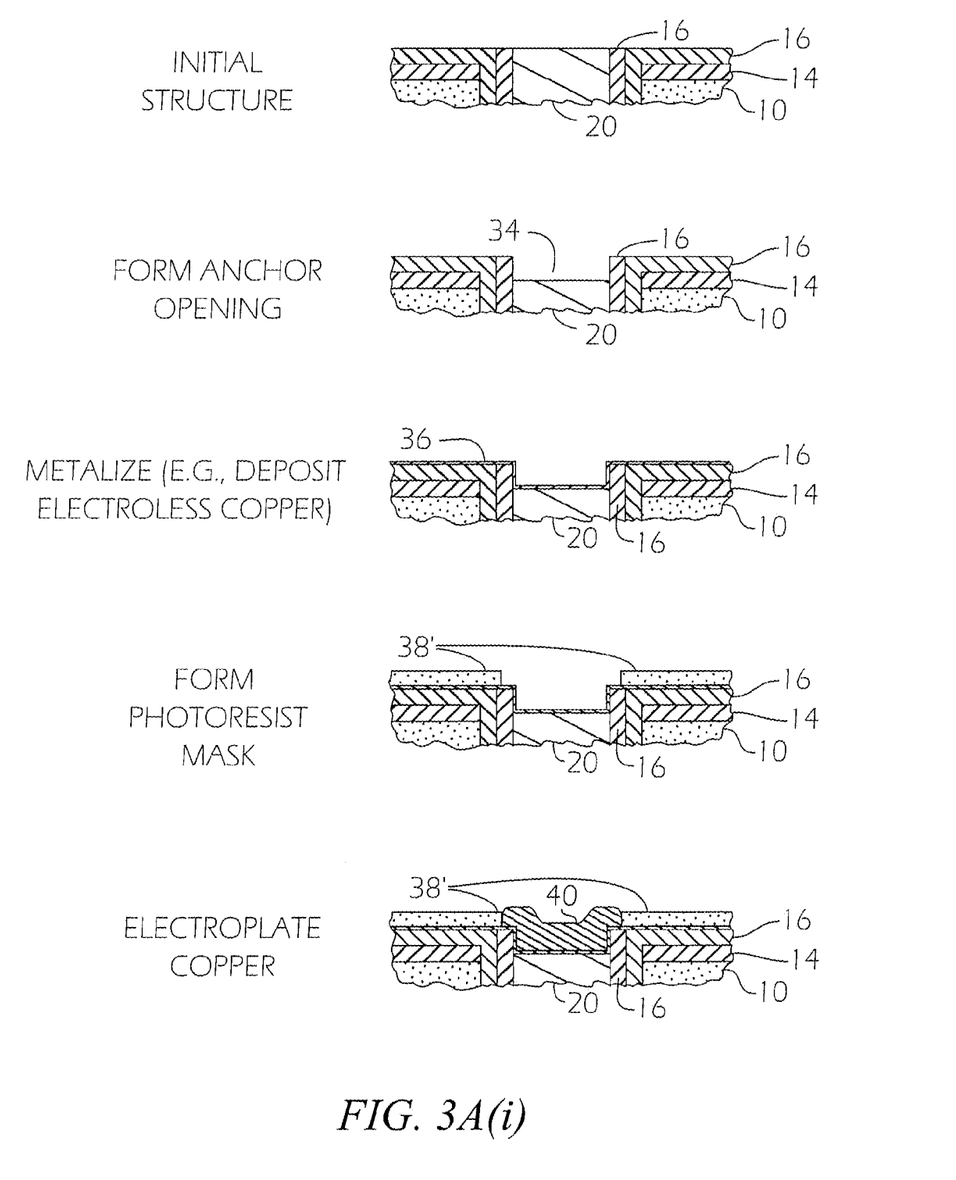
Figure 3B:
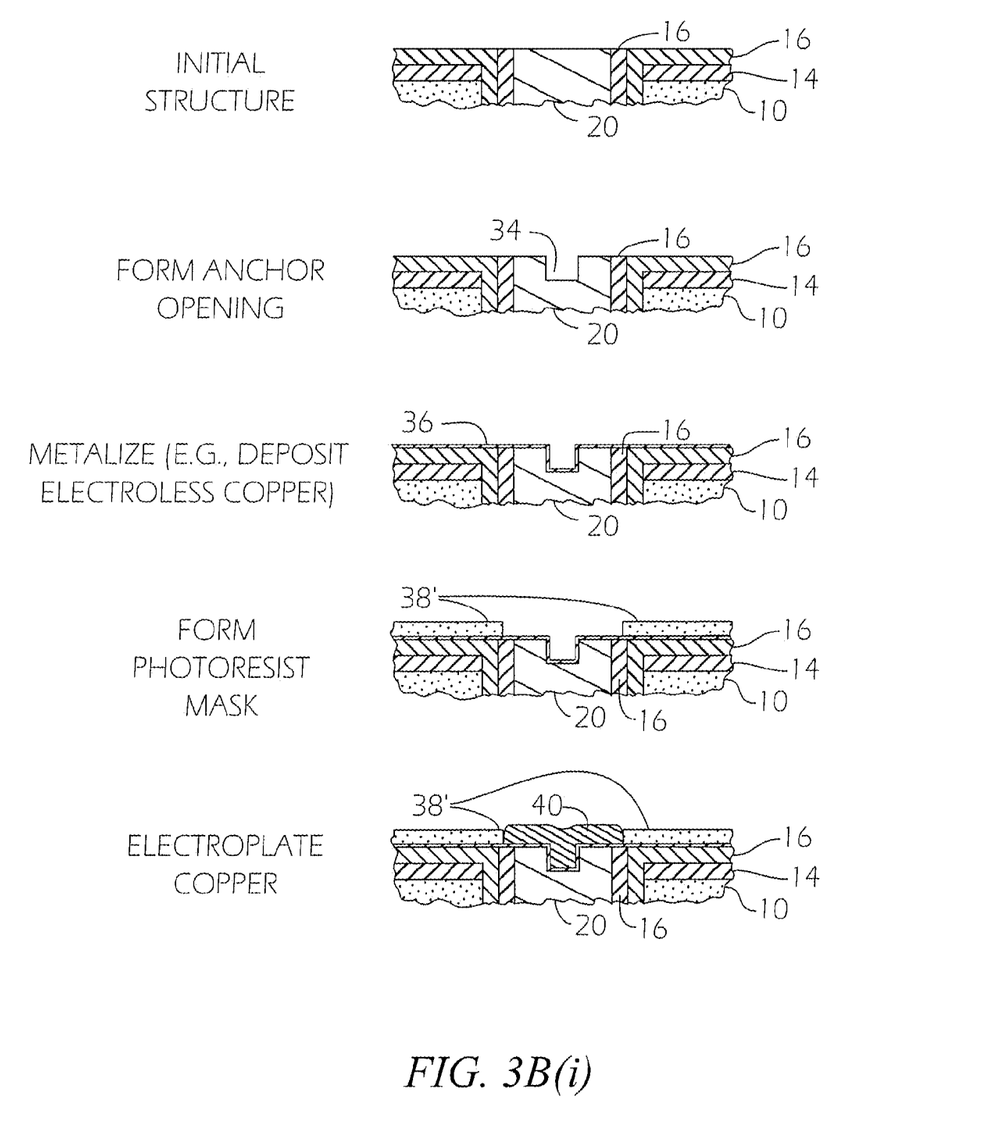

Referring to FIG. 3A(i), and FIG. 3A(ii), the anchored cap 48 may be formed by a sequence of fabrication steps in which the anchor opening 34 is formed first, and the anchored cap 48 is subsequently formed in the anchor opening 34 and protruding above the surface of the PCB. In a first step, an anchor opening 34 is formed in the via, by removing some of the via fill material 20 from the via. This may be accomplished by a plasma resin removal process if the via fill material 20 is nonconductive, or by a mechanical drilling or laser drilling process, for either conductive or nonconductive via fill material 20. In the case of the plasma resin etch process, the copper on the surface of the PCB, being conductive, is not etched and acts as the mask for the process, so that only the nonconductive via fill material 20 in the via is etched. The anchor opening 34 may, for example, be 0.01 to 25 mils deep, preferably, 1 to 10 mils (e.g., 25 to 250 microns) deep, or it may be deeper or less deep. Also, in one embodiment, the diameter of the anchor opening 34 is 2 to 50 mils, preferably 4 to 20 mils (e.g., 100 to 500 microns).

After the anchor opening 34 is formed, the surface of the anchor opening 34 along with the PCB may be metalized, i.e., a thin layer of electroless copper 36 may be deposited over the entire surface of the PCB using an electroless plating process. However, the present invention is not thereby limited. That is, instead of using an electroless plating process, the PCB may be metalized using a sputtering process, a vapor deposition process, etc. A photoresist mask (first photoresist mask) 38' may then be formed over the surface of the PCB, having a hole over the via, with the diameter of the hole in the photoresist mask 38' being as large as, or larger than, the diameter of the anchor opening 34.

Next a thicker layer of copper may be formed in the hole in the photoresist mask 38', by an electroplating process, and the photoresist mask 38' is then removed. The surface of the PCB may then be "planarized," so that this layer of electroplated copper 40 becomes the anchor portion 44 for the cap 48. The process of planarizing the surface of the PCB may involve mechanically grinding the surface to make it flat.

In a subsequent step as shown after the planarizing step, another photoresist mask (second photoresist mask) 38" may be formed over the surface. This photoresist mask 38" may again have a hole over the via, the diameter of this hole being the desired diameter of the cap portion 46 of the anchored cap 48. Finally the cap portion 46 may be formed by depositing a layer of electroplated copper 40 in the hole in the photoresist mask 38", and removing the photoresist mask 38".

Referring to FIG. 3B(i) and FIG. 3B(ii), the process for forming the anchored cap 48 for the embodiment illustrated in FIG. 2B may be substantially the same. To form an anchored cap 48 according to this embodiment, a smaller anchor opening 34 is, in the initial step, formed in the via fill material 20, so that the cap anchor portion 44, which fills the anchor opening 34, is correspondingly smaller.

Figure 2C:
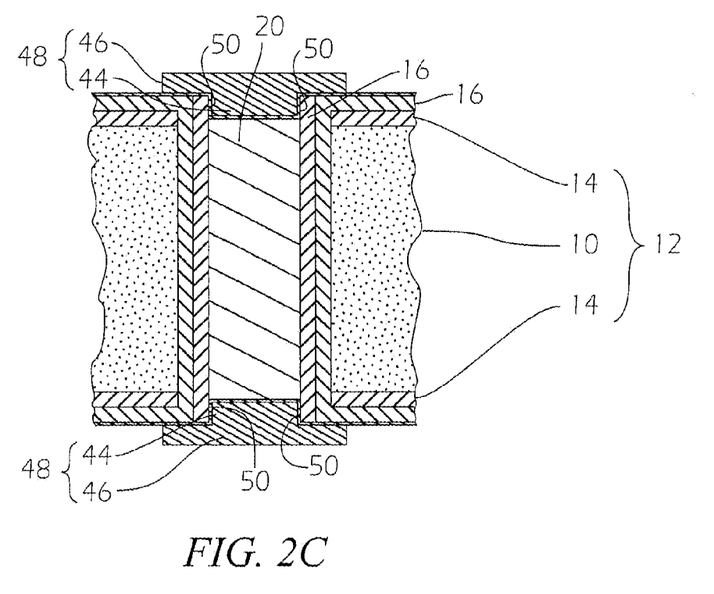
FIG. 2C is a cross-sectional breakaway view of a via with an anchored cap according to another embodiment of the present invention.
Figure 2D:
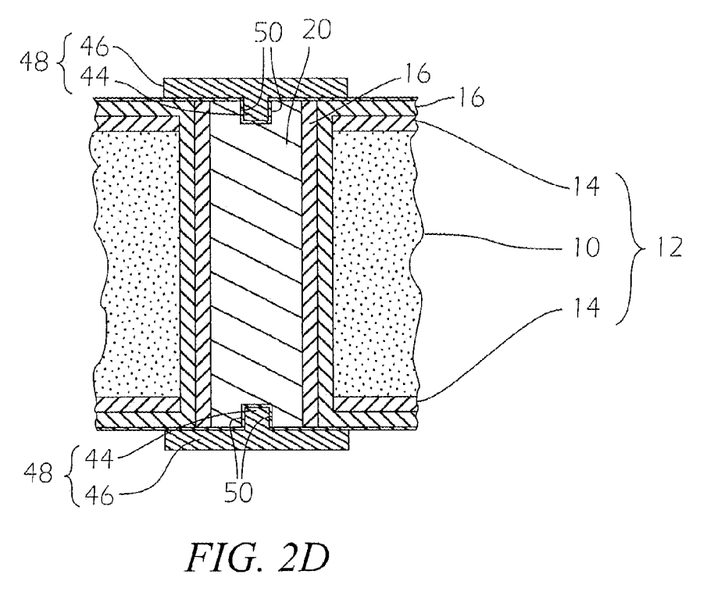
FIG. 2D is a cross-sectional breakaway view of a via with an anchored cap according to another embodiment of the present invention, FIG. 3A(i) and FIG. 3A(ii) show a series of cross-sectional breakaway views illustrating the structure after each of the principal fabrication steps of an exemplary method used to fabricate the anchored cap of the embodiment of FIG. 2A, FIG. 3B(i) and FIG. 3B(ii) show a series of cross-sectional breakaway views illustrating the structure after each of the principal fabrication steps of an exemplary method used to fabricate the anchored cap of the embodiment of FIG. 2B.

Referring to FIG. 2C and FIG. 2D, in alternate embodiments one layer of electroplated copper 40 can become both the anchor portion 44 and the cap portion 46. In this alternative embodiment and as shown in FIG. 2C and FIG. 2D, the cap portion 46 is integrally provided with the anchor portion 44 to form the cap 48 in one process step, and the subsequent planarizing may or may not be necessary.

Figure 3C:
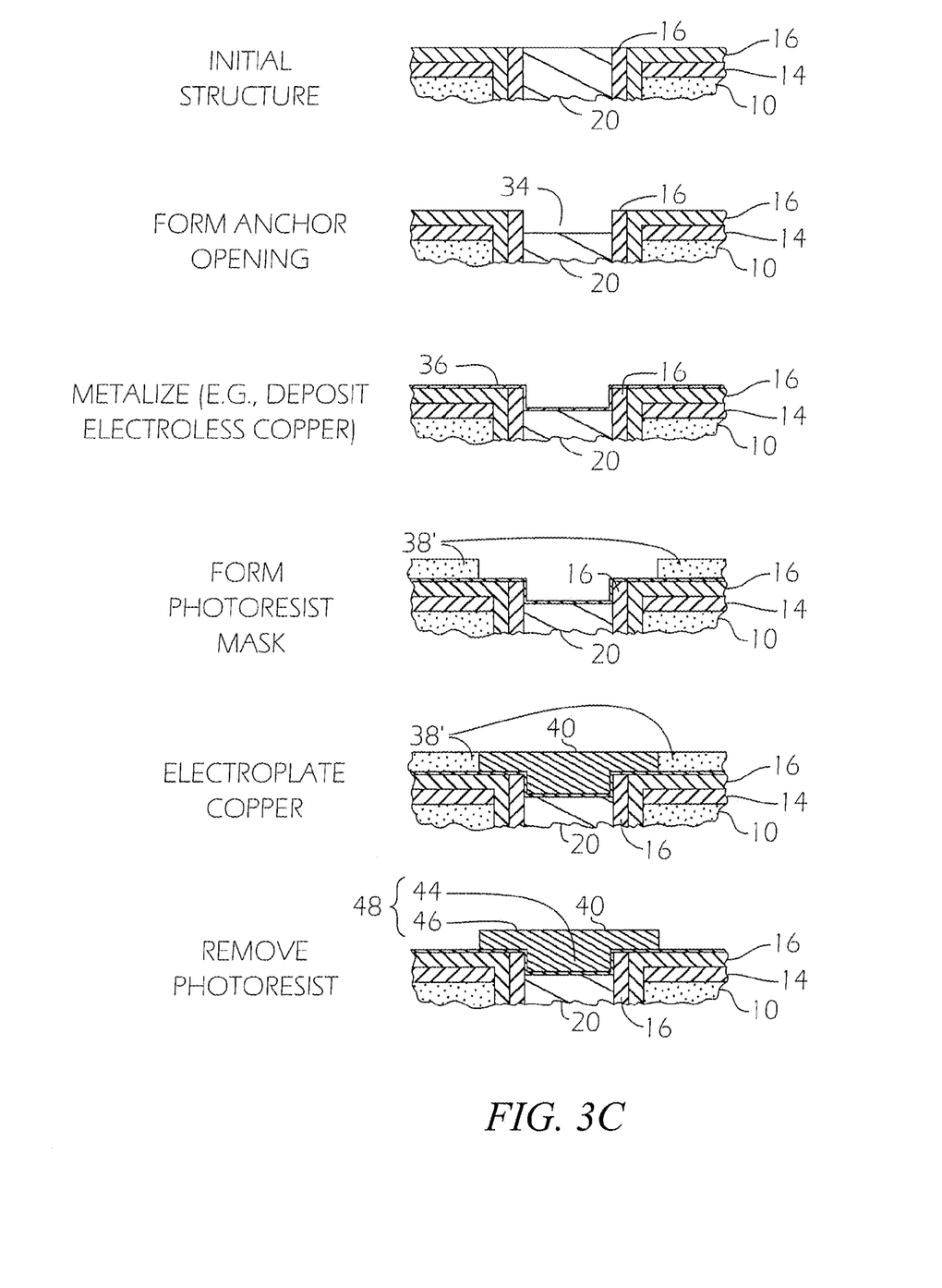
FIG. 3C is a series of cross-sectional breakaway views illustrating the structure after each of the principal fabrication steps of an exemplary method used to fabricate the anchored cap of the embodiment of FIG. 2C.
Figure 3D:
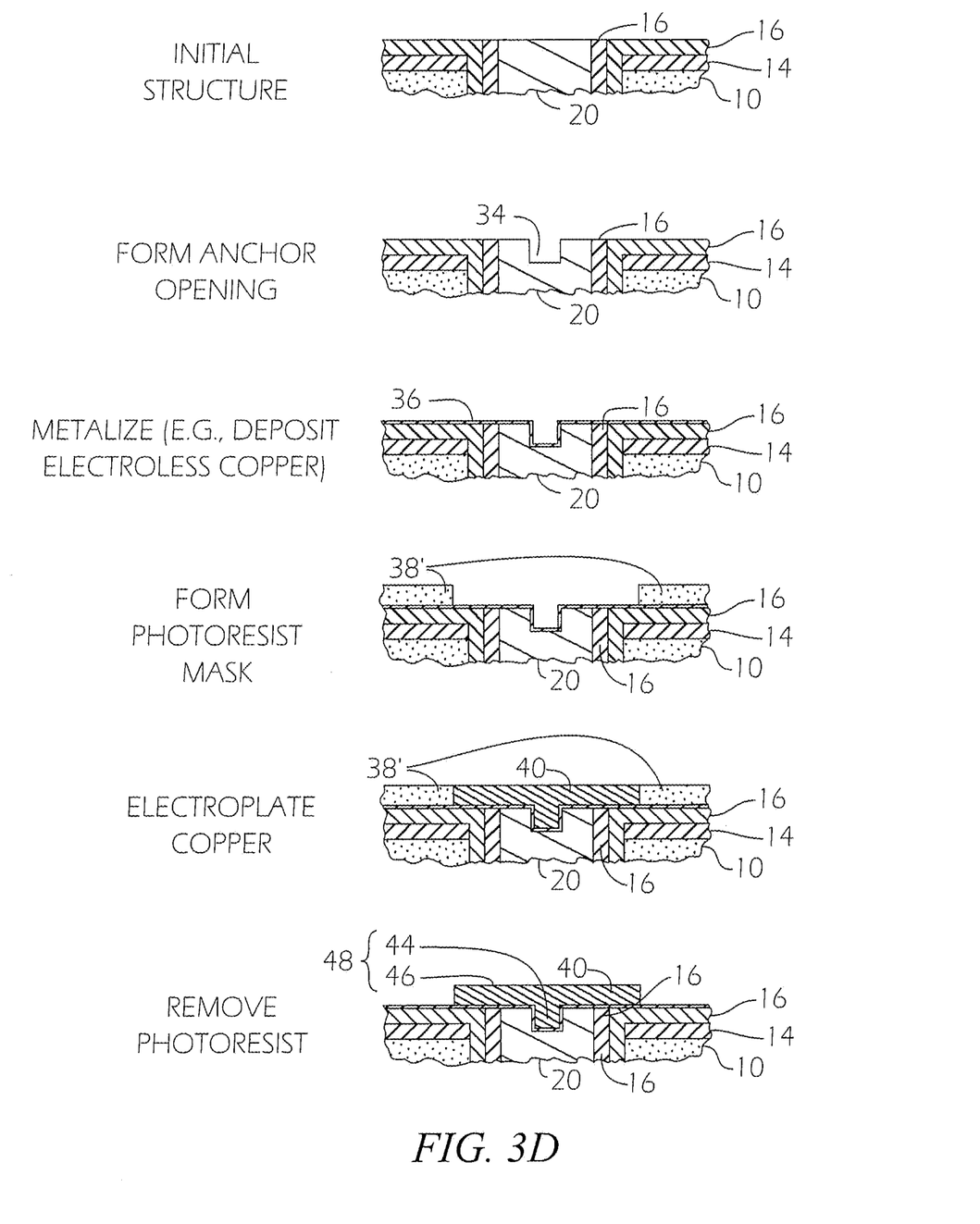
FIG. 3D is a series of cross-sectional breakaway views illustrating the structure after each of the principal fabrication steps of an exemplary method used to fabricate the anchored cap of the embodiment of FIG. 2D.

Referring to FIG. 3C and FIG. 3D, the anchored cap 48 with integral anchor 44 in this alternate embodiment may be formed by a sequence of fabrication steps similar to that illustrated in FIGS. 3A(i), 3A(ii), 3B(i), and 3B(ii), but in which the anchor portion 44 and the cap portion 46 are formed, after several preparatory steps, in a single deposition step, followed if desired by a planarization step. In a first step, an anchor opening 34 is formed in the via, the anchor opening may be metalized with a thin layer of copper 36 formed over the surface of the PCB, and a first photoresist mask 38' may be formed on the surface of the PCB. These steps may be accomplished by any of the methods described in the context of FIGS. 3A(i), 3A(ii), 3B(i), and 3B(ii). Next a thicker layer of copper may be formed in the hole in the photoresist mask 38', filling the anchor opening 34 to form the anchor portion 44, and also filling the hole in the photoresist mask 38' to form the cap portion 46. Subsequently, if necessary or desired, a planarizing step may be used to improve the quality of the top surface of the cap portion 46.

Although limited embodiments of a method for anchoring a conductive cap on a filled hole in a printed circuit board have been specifically described and illustrated herein, many modifications and variations will be apparent to those skilled in the art. For example, the metal layers on the PCB surface and in the via may be made of a metal other than copper, or of a combination of metals, alloyed together or layered on top of each other. The shape of the anchor opening 34 may, instead of being cylindrical as illustrated, be tapered or bowl-shaped, or it may have an arbitrary or irregular shape. Accordingly, it is to be understood that the method for anchoring a conductive cap on a filled hole in a printed circuit board employed according to principles of this invention may be embodied other than as specifically described herein. The invention is also defined in the following claims, and equivalents thereof.

What is claimed is:

1. An anchored cap on a filled via in a printed circuit board (PCB), the anchored cap comprising:
    a conductive anchor portion extending into an anchor opening in the filled via to contact a plated conductive layer on a sidewall of the filled via; and
    a conductive cap portion protruding above the surface of the PCB on top of the anchor portion.

2. The anchored cap of claim 1, wherein the anchor portion in the filled via is 0.01 to 25 mils deep.

3. The anchored cap of claim 1, wherein the anchor portion in the filled via is 1 to 10 mils deep.

4. The anchored cap of claim 1, wherein the anchor opening has a diameter from 2 to 50 mils.

5. The anchored cap of claim 1, wherein the anchor opening has a diameter from 4 to 20 mils.

6. A printed circuit board (PCB) comprising:
    a substrate having a filled via, the filled via having an anchor opening;
    a conductive anchor portion extending into the anchor opening in the filled via to contact a plated conductive layer on a sidewall of the filled via; and
    a conductive cap portion protruding above the surface of the PCB on top of the anchor portion.

7. The PCB of claim 6, wherein the anchor portion in the filled via is 0.01 to 25 mils deep.

8. The PCB of claim 6, wherein the anchor portion in the filled via is 1 to 10 mils deep.

9. The PCB of claim 6, wherein the anchor opening has a diameter from 2 to 50 mils.

10. The PCB of claim 6, wherein the anchor opening has a diameter from 4 to 20 mils.

11. The anchored cap of claim 1, wherein the anchored cap is in electrical contact with a conductive layer at the surface of the PCB.

12. The PCB of claim 6, wherein the conductive cap is in electrical contact with a conductive layer at the surface of the PCB.

* * * * *